(12) United States Patent
Mizuno et al.

(10) Patent No.: US 7,935,393 B2
(45) Date of Patent: May 3, 2011

(54) METHOD AND SYSTEM FOR IMPROVING SIDEWALL COVERAGE IN A DEPOSITION SYSTEM

(75) Inventors: Shigeru Mizuno, Delmar, NY (US); Takashi Sakuma, Yamanashi (JP); Yasushi Mizusawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 871 days.

(21) Appl. No.: 11/835,210

(22) Filed: Aug. 7, 2007

(65) Prior Publication Data

US 2009/0041950 A1 Feb. 12, 2009

(51) Int. Cl.
*C23C 14/00* (2006.01)
*H05H 1/24* (2006.01)
(52) U.S. Cl. ........... 427/523; 427/569; 204/298.06; 156/345.51; 156/345.54; 156/345.55; 118/715; 118/729; 118/730
(58) Field of Classification Search .......... 427/523, 427/569; 156/345.51, 345.54, 345.55; 118/715, 118/729, 730
See application file for complete search history.

(56) References Cited

U.S. PATENT DOCUMENTS

| | | | | |
|---|---|---|---|---|
| 4,135,097 | A * | 1/1979 | Forneris et al. | 250/492.3 |
| 4,628,209 | A * | 12/1986 | Wittkower | 250/492.2 |
| 5,248,371 | A * | 9/1993 | Maher et al. | 156/345.43 |
| 2001/0023742 | A1 * | 9/2001 | Schmitt | 156/345 |
| 2004/0188239 | A1 * | 9/2004 | Robison et al. | 204/192.3 |
| 2005/0279624 | A1 * | 12/2005 | Brcka | 204/192.12 |
| 2009/0194413 | A1 * | 8/2009 | Wickramanayaka et al. | 204/298.06 |

OTHER PUBLICATIONS

Jozef Brcka, U.S. Appl. No. 11/693,010, Control of Ion Angular Distribution Function at Wafer Surface, filed Mar. 29, 2007.

* cited by examiner

*Primary Examiner* — Shamim Ahmed

(57) ABSTRACT

Embodiments of a method and system for improving the consistency of a layer or a plurality of layers with a desired profile in a deposition system are generally described herein. Other embodiments may be described and claimed.

20 Claims, 8 Drawing Sheets

US 7,935,393 B2

METHOD AND SYSTEM FOR IMPROVING SIDEWALL COVERAGE IN A DEPOSITION SYSTEM

FIELD OF THE INVENTION

The present invention relates to integrated circuit (IC) fabrication and to the control of the ions onto the surface of a wafer during processing. More particularly, the invention relates the control of the angles of incidence of ions onto a wafer surface during plasma processing of a semiconductor wafer held on radio frequency (RF)-biased wafer holders in processing tools.

BACKGROUND OF THE INVENTION

In plasma processing systems, semiconductor wafers are placed on static substrate holders comprising a planar or substantially planar electrode, such as electrostatic chucks (ESCs) or chucks provided with mechanical wafer clamps, where the substrates, or wafers, are exposed to ions from the plasma formed using radio frequency (RF) energy. Energy of the ions incident on the wafers from the plasma is typically independently controlled by varying the RF bias power level, while the ion density is usually controlled by control of an independent plasma source. The plasma source can be, for example, an inductively coupled plasma (ICP) source, a dual capacitively-coupled plasma (CCP) source having a secondary top electrode biased at another RF frequency, a helicon plasma source, a microwave plasma source, a magnetron, or some other independently operated source of plasma energy.

An RF biased ESC operates as CCP source in which a wafer having a surface to be etched or coated is placed on a wafer support electrode. The wafer support electrode is typically coupled to an RF generator through a blocking capacitor and an impedance matching unit, which does not allow real current to flow from the electrode to the RF generator. FIG. 1A is a diagram that represents a bulk plasma 10 in a plasma process chamber in which a substrate 15 is supported on a substrate support 14 for processing. A plasma sheath 12 occupies a boundary between the bulk plasma 10 and the surface of the wafer 15. Between the bulk plasma 10 and the plasma sheath 12 is a region that can be referred to as the plasma presheath 13.

At the plasma-to-surface boundary, electrons escape from the plasma and charge the wafer surface with a negative charge. This occurs because the plasma and the biased ESC electrode will find a condition at which electron current reaching the electrode from the plasma exactly balances ion current averaged over one RF cycle. Since electrons are more mobile than ions, the electrode acquires a negative potential that will limit electron current and encourage positive ion current from the plasma to the wafer surface. This negative potential is called the self-bias voltage and results in an energetic ion bombardment of the surface from the plasma, which can, for example, etch the wafer surface. Since the wafer is not formed of a conductive material, and since the substrate holder is usually coated with a dielectric or insulating material, the actual self-bias on the conductive portion of holder closer to the RF source is more negative than the self-bias on the top of the support. Changing applied RF bias power can control the ion bombardment energy and can partially affect the ion flux as well.

The initial kinetic energy of the ions in bulk plasma 10 is related to the gas temperature and, typically, is within a range of 0.05 to 0.1 electron volts (eV). Ion motion in the plasma 10 is random due to collisions with background gas atoms or molecules. Also, a directional component may be present in the plasma 10 due to ambipolar diffusion of the ions in an ambipolar electric field inside the plasma 10, which is usually small, approximately 0.1 to 1 V/cm, but which can contribute to asymmetry in feature processing by bombarding ions. Before ions enter the sheath 12 from the plasma 10, they gain some directional energy within the presheath 13. This energy is approximately half the electron temperature ($T_e$) of the plasma 10. Sheath theory tells us that ions enter plasma sheaths with a so-called Bohm velocity, which is proportional to $kT_e/m_i$, where $m_i$ is the mass of the ion. In an actual plasma sheath 12, ions are accelerated by a sheath voltage $E_{sheath}$ that is the difference between the plasma voltage and the bias voltage on the wafer 15. The sheath voltage $E_{sheath}$ is much larger than the energy gain in the presheath 13, and is much-much larger than the kinetic energy of the ions in the bulk plasma 10.

Due to the combined random kinetic energy gained in the bulk plasma 10 and directional energy gained within the presheath 13 and sheath 12, ions will hit the surface of the wafer 15 with a particular angle, or in a particular distribution of angles. This distribution of angles can be referred to as the Ion Angular Distribution Function (IADF) 16, which can be defined for given process conditions. In typical systems of the prior art, most of the ions are within a small angle cone 17 of less than about 20 degrees when pressures are in the range of 1 milli-Torr (mTorr) to several 100 s of mTorr.

Experimental data from literature show the IADF at the wafer 15 in an ICP plasma process to be approximately as illustrated as curve 18 in FIG. 1B, shown for pressures at about 2.5 mTorr, to that as illustrated as curve 19 at pressures at about 50 mTorr. The graphs are plots of the angular distribution of ions incident at a given point on the surface of a wafer, with the angle being measured relative to a vector normal to the wafer surface at the given point. The graph of FIG. 1B shows the distribution at angles measured in a vertical plane through the given point. This distribution is not necessarily the same in every direction or in every vertical plane through the point, and may therefore be regarded as a three-dimensional function of an angle $\phi$ to the normal, through a plane oriented at some angle $\theta$ to a reference line on the wafer's surface.

Furthermore, the IADF is not necessarily the same at every point on the surface of the wafer, and can vary across the surface of the wafer. Therefore, the IADF can also be considered as a function of $\phi$ and $\theta$, that additionally varies as a function of the x,y coordinates on the wafer surface, or more conveniently, of the R,$\ominus$ coordinates of the points on the wafer surface. It is not uncommon to experience different ion incidence angles between the center and the edge of a wafer, for example.

The IADF plays an important role in feature coverage in ionized physical vapor deposition (iPVD) and other ion-controlled deposition and etching processes. Control of IADF to produce ideal feature coverage has been a challenge because a lack of independent process variables that allow direct control of the IADF at the wafer surface that is in contact with the plasma. Movement of the substrate using a substrate holder comprising a planar or substantially planar electrode to modify the IADF may negatively affect an electromagnetic field of the plasma. Additionally, movement of the substrate to modify an IADF may provide an opportunity to damage or otherwise compromise the integrity of the substrate.

BRIEF DESCRIPTION OF THE DRAWINGS

The present invention is illustrated by way of example and not as a limitation in the accompanying figures.

DETAILED DESCRIPTION

There is a general need for forming very thin layers on surfaces resulting in a film with a consistent or desired thickness profile, for example, to improve sidewall coverage in a deposition system. One way to form films on planes, structures or material overlying complex geometry, such as high aspect vias, is to use an ionized physical vapor deposition (iPVD) system with ions that have a relatively large distribution of ion incidence angles and/or dynamically variable ion incidence angles. By using an iPVD system with a relatively large distribution of ion incidence angles and/or dynamically variable ion incidence angles, a very consistent or a layer or plurality of layers with a desired profile may be produced resulting in a film that conforms to the existing surface topography with a desired thickness profile, uniform or variable, across the surface. The surface may be capped with one or more thin layers comprising a metal, a dielectric, a polysilicon, or another material typically used in the manufacture of a semiconductor device. A properly configured iPVD system with a relatively large distribution of ion incidence angles and/or dynamically variable ion incidence angles may be used to apply a very accurately controlled thickness of material, or a material with a desired thickness profile over a surface.

Figure 1A:
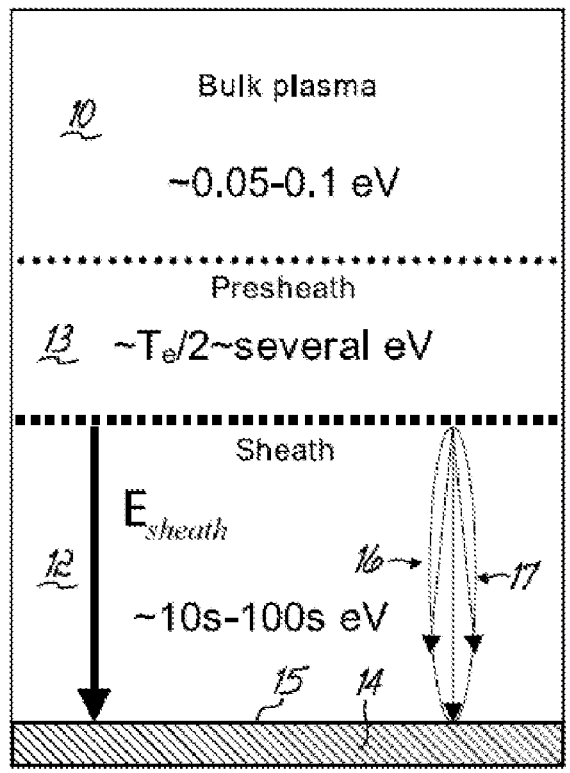
FIG. 1A is a diagram illustrating a bulk plasma, a pre-sheath, and a plasma sheath in a typical plasma processor of the prior art.
Figure 1B:
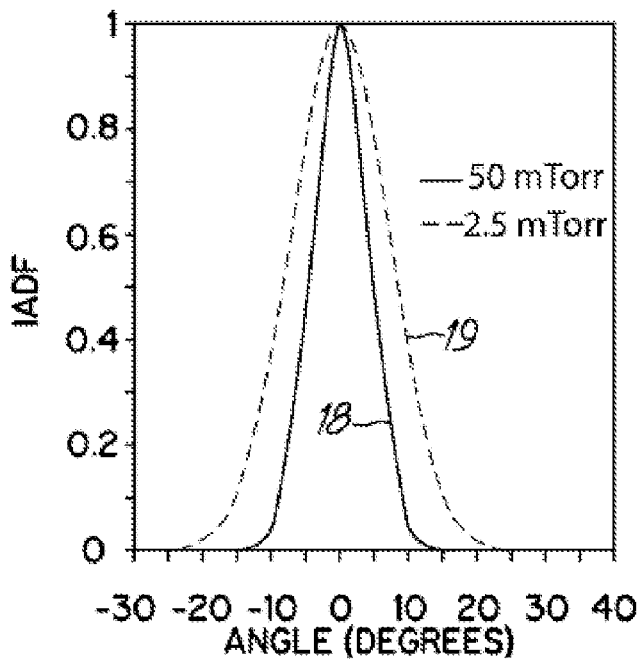
FIG. 1B is a graph of typical ion angular distribution functions (IADF) in an inductively coupled plasma represented by FIG. 1A at 2.5 mTorr and 50 mTorr.
Figure 2A:
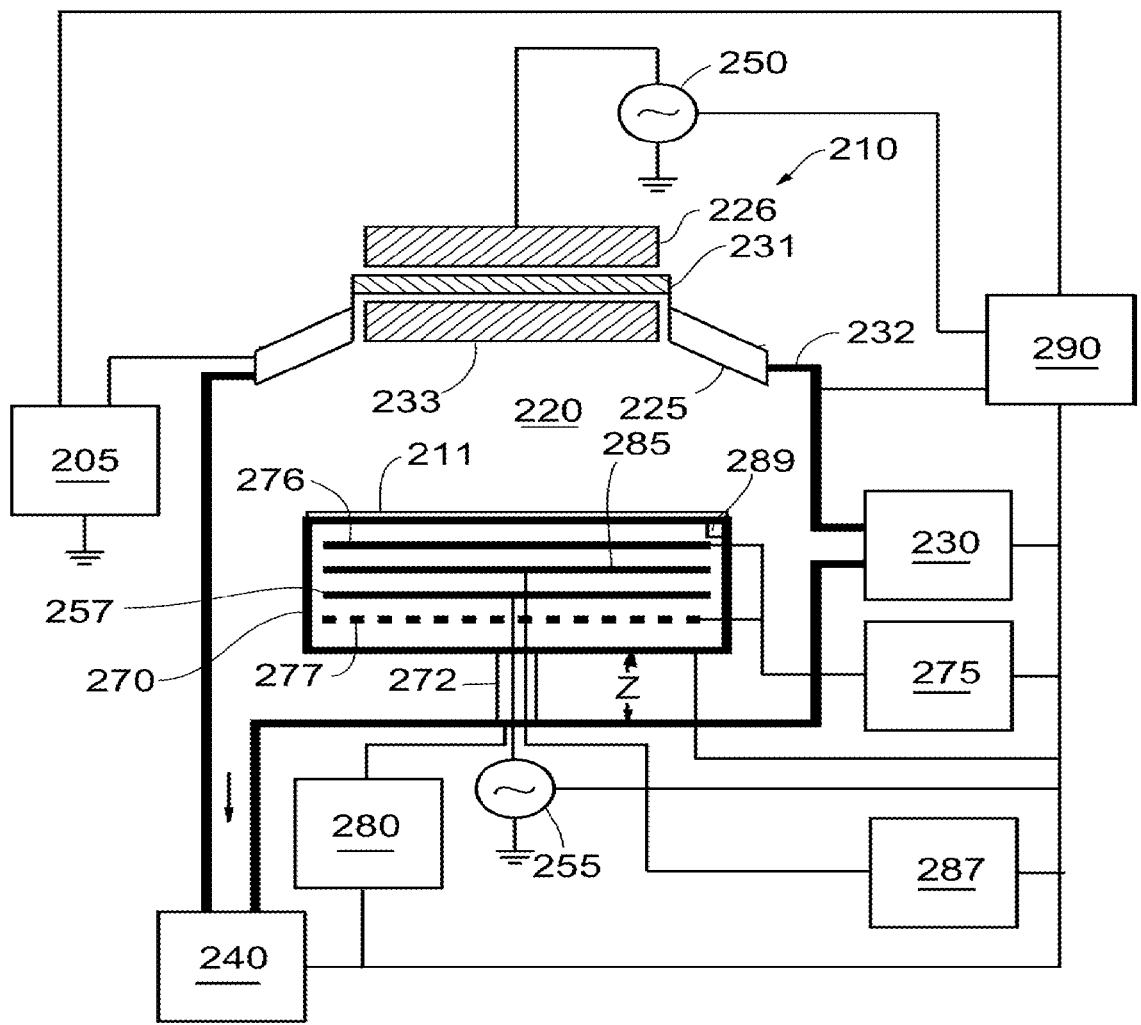
FIG. 2A is a block diagram of an iPVD processing system according to one embodiment of the invention.

Referring back to the figures, FIG. 2A illustrates an exemplary block diagram of an iPVD processing module 210 according to an embodiment of the invention. In the illustrated embodiment, an iPVD system 200A is shown. The iPVD system 200A can comprise an iPVD processing module 210, a direct current (DC) source 205 coupled to a target 225 that is coupled to a process chamber 220, a process gas supply system 230 that can be coupled to process chamber 220, a pressure control system 240 that can be coupled to the process chamber 220, a RF source 250 that can be coupled to the process chamber 220, an RF bias generator 255 that can be coupled to a non-planar electrode 257 in the substrate holder 270, a backside gas supply system 280 that can be coupled to the substrate holder 270, and an electrostatic chuck (ESC) control unit 287 coupled to the ESC 285.

The iPVD system 200A comprises a controller 290 that may be coupled to the process chamber 220, the DC source 205, the gas supply system 230, the pressure control system 240, the RF source 250, the RF bias generator 255, the substrate holder 270, the thermal control system 275, the backside gas supply system 280, and the ESC control unit 287.

The iPVD processing module 210 further comprises an antenna 226, a window 231 coupled to the antenna 226, a louvered deposition baffle 233 coupled to the window 231, a target 225 coupled to the process chamber 220. RF power can be supplied to the antenna 226 from the RF source 250, and can be used to deliver electromagnetic energy to the process chamber 220 and create an inductively coupled plasma (ICP) in the process chamber 220. The antenna 226 can be electrically connected using a RF matching network (not shown) to, and selectively energized or powered by, the RF source 250. The RF source 250 can provide a time-varying RF current at a frequency between about 100 kilahertz (kHz) and about 100 megahertz (MHz) that is supplied to the antenna 226 at a power ranging between about 100 watts (W) and about 10,000 W. For example, an operating frequency of approximately 13.56 MHz can be used. Alternately, other frequencies can be used. When energized by the RF source 250, the antenna 226 radiates isotropic RF electromagnetic fields. A metallic outer enclosure or cage (not shown) can be used to surround the antenna 226 to confine the radiated RF electromagnetic fields therein to ensure the safety of nearby persons and to prevent electromagnetic interference with surrounding electronics.

In one embodiment, a controllable backside pressure can be established that allows the controller 290 to set the relative influence of the backside pressure on the respective process steps differently, depending on process parameters. This may include variable backside pressures or flexible duty cycles.

The antenna 226 can be positioned outside of the process chamber 220 behind a window 231 in a chamber wall 232. A louvered deposition baffle 233, preferably formed of a slotted metallic material, is located inside of the process chamber 220 closely spaced from the window 231 to shield the window 231 from deposition. The controller 290 can be used to determine the amount of ICP power to provide and when to have it applied to the antenna 226. For example, ICP power from the RF source 250 to the antenna 226 can be switched between different power levels during the different steps in a barrier or metal deposition process.

The substrate holder 270, which may include an electrostatic chuck 285, can be coupled to the process chamber 220 using a Z-motion drive 272. The Z-motion drive 272 can be used to adjust a substrate-to-source distance to provide the best deposition uniformity. The controller 290 can be used to determine the gap size required during the barrier deposition process and provide the control data to the Z-motion drive 272 when necessary. During a barrier and/or a seed layer deposition process, the substrate-to-source distance can vary from approximately 150 millimeters (mm) to approximately 300 mm.

The substrate holder 270 can accommodate a 100 mm, 150 mm, 200 mm, a 300 mm, or even a larger substrate. For example, a substrate 211 can be transferred into and out of process chamber 220 through an opening (not shown) that is controlled by a gate valve assembly (not shown). In addition, the substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, the substrate 211 can be held in place on top of the substrate holder 270 using an electrostatic chuck 285. Alternately, other clamping means may be used.

In addition, a substrate temperature can be controlled when the substrate 211 is on the substrate holder 270. The substrate holder may include a heater assembly 276 and a cooling assembly 277 that can be coupled to a temperature control system 275. The heater assembly 276 and the cooling assembly 277 can be used along with one or more backside gases to establish a desired substrate temperature. For example, the temperature of the substrate 211 can be controlled to obtain an optimized metallization process for filling a given topography. The controller 290 can be used to monitor and control the substrate temperature. For example, the cooling assembly 277 may include fluid passages (not shown) in the substrate holder 270 and the appropriate temperature controls.

A thermal conductivity between the substrate holder 270 and the substrate 211 can be controlled by providing backside gas between the substrate 211 and the substrate holder 270. Process parameters can be controlled during the barrier and/or seed layer process to ensure that the metal deposited in high aspect ratio structures, such as via structures, is uniform. For example, heat generated in the substrate 211 during plasma processing can be extracted efficiently by the substrate holder 270 to keep the temperature of the substrate 211 at a substantially constant temperature, or the heat can be used to increase the substrate temperature. Gas channels (not shown) can be used to direct a backside (heat transfer) gas, such as helium or argon, between the top of the substrate holder 270 and the facing surface of the substrate 211. For example, a two-zone system may be used to establish different and independent backside pressure values for a center portion and an edge portion thereby providing a different thermal conductivity between the substrate holder 270 and different portions of the substrate 211.

The backside gas can be used to control the transfer of heat energy between the substrate holder 270 and substrate 211 by providing an efficient heat transfer medium. The electrostatic chuck 285 can also be used to control the transfer of heat between the substrate 211 and substrate holder 270. For example, an electrostatic force can be made approximately uniform to cause a significant portion of a facing surface of the substrate 211 to physically contact the top surface of the substrate holder 270 and to contact the top surface of the substrate holder 270 with a substantially uniform force. The electrostatic force can also be controlled to limit the leakage of heat transfer gas from beneath the substrate 211 when the backside gas pressure changes, thereby maintaining a controlled backside gas pressure and providing a desired thermal conductivity between the substrate 211 and the substrate holder 270.

One or more temperature sensors 289 can be positioned at one or more locations on or within the substrate holder 270 and can be coupled to the controller 290 to provide an indication of the temperature of different portions of substrate holder 270. The temperature of the substrate holder 270 can be used to determine the temperature of the substrate 211 and the controller 290 can provide feedback information to the temperature control system 275 and the backside gas supply system 280 for regulating the temperature of substrate 211.

For example, the backside gas can be supplied at a pressure in a range from approximately zero Torr to approximately ten Torr, and the backside gas can apply a force to the substrate 211 due to the pressure differential between the backside gas pressure and the pressure within the process chamber 220. The vacuum pressure within the process chamber 220 can vary during processing between about 5 milli-Torr (mtorr) and about 500 mtorr. The force applied by the backside gas acts to displace the substrate 211 from the substrate holder 270. To counteract this force, a clamping voltage can be applied to the electrostatic chuck 285 to establish an attractive electrostatic force of a magnitude sufficient to secure the substrate 211 to the substrate holder 270.

RF bias power can be supplied to a non-planar electrode 257 in the substrate holder 270 using the RF bias generator 255, and can be used to provide a substrate bias. The non-planar electrode 257 may be comprised of a metal with an irregularly shaped top surface. The controller 290 can be used to determine the timing and amount of RF bias power applied to the substrate holder 270. For example, RF bias power can be turned on to a level appropriate during barrier and/or seed layer processes to control the bias on the substrate 211 to affect the process.

An operating frequency for the RF bias generator 255 can range from 1 megahertz (MHz) to 100 MHz. The RF bias generator 255 can be used to selectively apply a bias potential that accelerates positively charged plasma components toward the substrate 211. The bias potential provided by the RF bias generator 255 substantially determines the kinetic energies of positive ions attracted to the substrate 211 from the plasma. The RF bias generator 255 typically operates at a frequency of about 13.56 MHz and at a power between about 100 watts (W) and about 1000 W. Alternately, the RF bias generator 255 may be omitted from the processing system and the substrate holder 270 may be either grounded or electrically floating. Alternately, other operating frequencies may be used, such as 2 MHz or 27 MHz.

Process gas can be provided to the process chamber 220 by the gas supply system 230. During iPVD processes that are used to deposit a ruthenium (Ru)-containing material, the gas supply system 230 can provide an inert gas and/or an oxygen containing gas. During an iPVD process, the process gas flow rate can range from approximately zero standard cubic centimeters per minute (sccm) to approximately 1000 sccm. When an inert gas is used during an iPVD process, the inert gas may include argon (Ar), helium (He), krypton (Kr), radon (Rn), xenon (Xe), or a combination thereof, and the flow rates for the inert gas can range from approximately zero sccm to approximately 1000 sccm. When an oxygen-containing gas is used during an iPVD process, the oxygen-containing gas can comprise oxygen ($O_2$), nitric oxide (NO), nitrous oxide ($N_2O$), carbon monoxide (CO), carbon dioxide ($CO_2$), or water ($H_2O$) or a combination thereof, and the flow rate for the oxygen-containing gas can range from approximately zero sccm to approximately 1000 sccm.

In alternate embodiments, a nitrogen-containing gas may be used during an iPVD process, and the flow rate for the nitrogen-containing gas can range from approximately 0 sccm to approximately 1000 sccm. The nitrogen-containing gas may comprise nitrogen (N2), nitric oxide (NO), nitrous oxide (N2O), nitrogen dioxide (NO2) and ammonia (NH3).

Chamber pressure can be controlled using the pressure control system 240. In addition, process gas can be supplied into the process chamber 220 by the process gas supply system 230. The chamber pressure can be maintained at a low pressure by the pressure control system 240. The controller 290 can be used to control the pressure control system 240 and/or the gas supply system 230, and to control the chamber pressure accordingly.

Direct current power can be supplied from a DC source 205 to the target 225. The controller 290 can be used to determine the amount of DC power to provide and when to have it applied to the target.

The controller 290 can be configured to provide control data to the system components and receive process and/or status data from the system components. In addition, the controller 290 may be coupled to another control system (not shown), and can exchange information with the other control system. For example, the controller 290 may comprise a microprocessor, a memory (e.g., volatile or nonvolatile memory), and a digital I/O port capable of generating control voltages sufficient to communicate and activate inputs to the iPVD system 200A as well as monitor outputs from the iPVD system 200A. Moreover, the controller 290 can exchange information with the system components, and a program stored in the memory can be utilized to control the aforementioned components of the iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
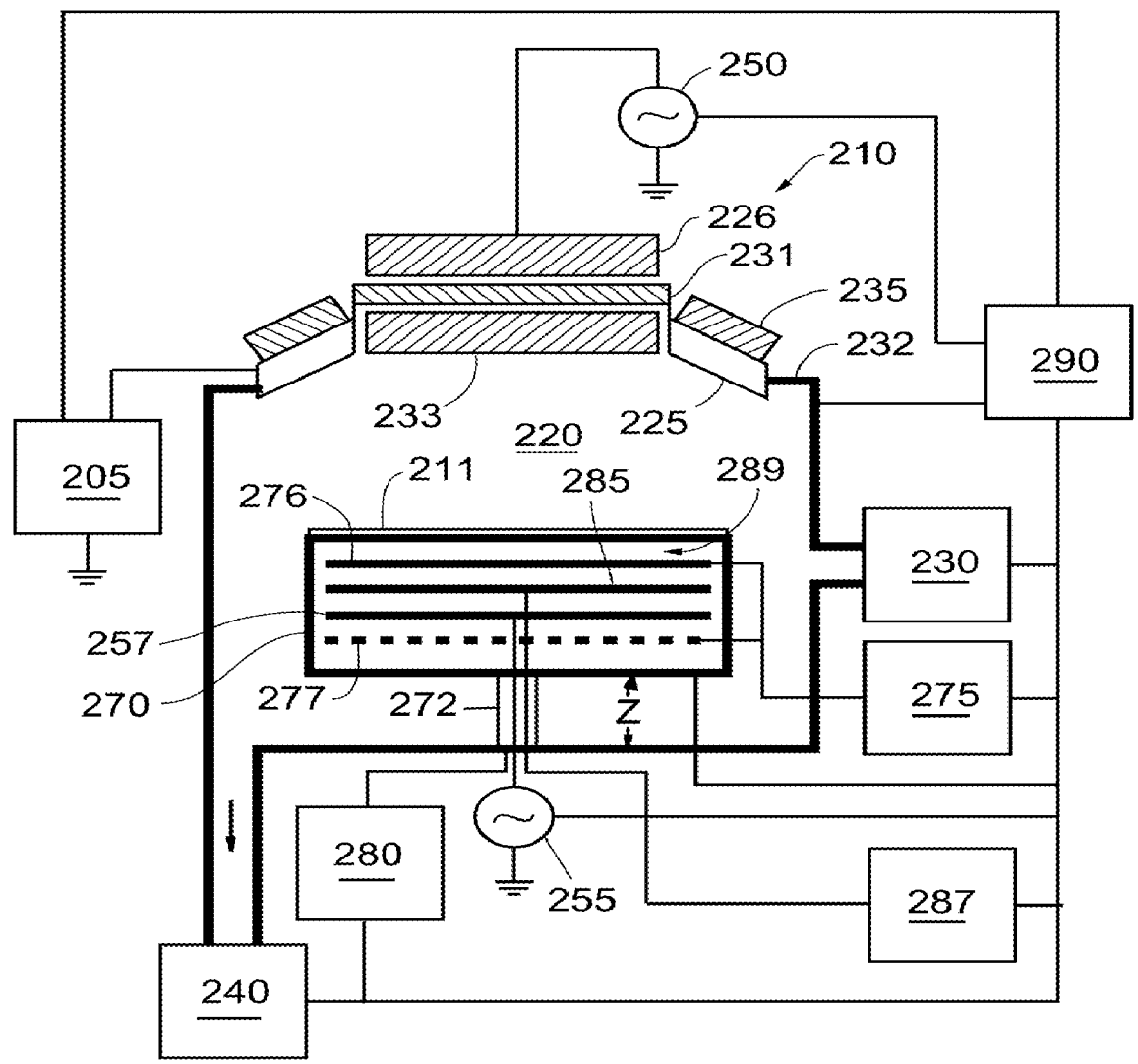
FIG. 2B is a block diagram of an iPVD processing system according to an alternate embodiment of the invention.

FIG. 2B illustrates an exemplary block diagram of an iPVD processing module 210 according to an alternate embodiment of the invention. In the illustrated embodiment, an iPVD system 200B is shown that can include the iPVD system shown in FIG. 2A along with a magnet assembly 235 coupled to the process chamber 220. The magnet assembly 235 may be used to shape the plasma within the process chamber 220.

As shown in FIG. 2B, a magnet assembly 235 can be located behind the target 225 and can be used to produce and/or change a static magnetic field shape in a process volume within the chamber. In some embodiments, a barrier and/or seed layer process can be performed using a magnet assembly 235 having a weak magnetic field strength. Field lines from the magnet assembly 235 can extend into the process volume. In alternate embodiments, these or other field lines present in the chamber may be caused to change to enhance the barrier and/or seed layer process. For example, magnetic fields may be changed by controlling the magnet assembly 235 configuration, by physically moving and/or rotating one or more magnets. In addition, an electromagnet or electromagnet component may be used to change a magnetic field. In addition, a local static magnetic field may be used to optimize the performance of the target.

Some magnet pack configurations for iPVD may typically produce static magnetic field strength at the target surface of over 150 Gauss or several hundred Gauss, to provide confinement of the plasma and a desired erosion profile and high target utilization. Reducing the static magnetic field strength at target surface to about 5 Gauss to 10 Gauss eliminates this confinement effect.

In various embodiments, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate holder temperature, substrate temperature, etching rate, and/or deposition rate.

The controller 290 can be used to determine the amount of heat energy that the heater assembly 276 provides and when to have it provided to the substrate 211. The amount of heat energy can be changed between different levels during a barrier and/or seed layer process. In addition, the controller 290 can use the cooling element 277 to control the temperature of the substrate holder 270 and the substrate 211. For example, the thermal mass of the substrate holder 270 can be reduced and/or controlled to optimize its thermal response time. Furthermore, the thermal conductance between the substrate holder 270 and the substrate 211 can be controlled by providing backside gas between the substrate 211 and the substrate holder 270. The controller 290 can monitor and control the substrate temperature, the temperature of the substrate holder 270, the temperature control system 275, the backside gas supply system 280, and other process parameters during a barrier and/or seed layer process to ensure that the metal deposition within the features is substantially uniform. In addition, the performance of the electrostatic chuck 285 may be controlled to compensate for changes in the backside pressure.

Figure 3:
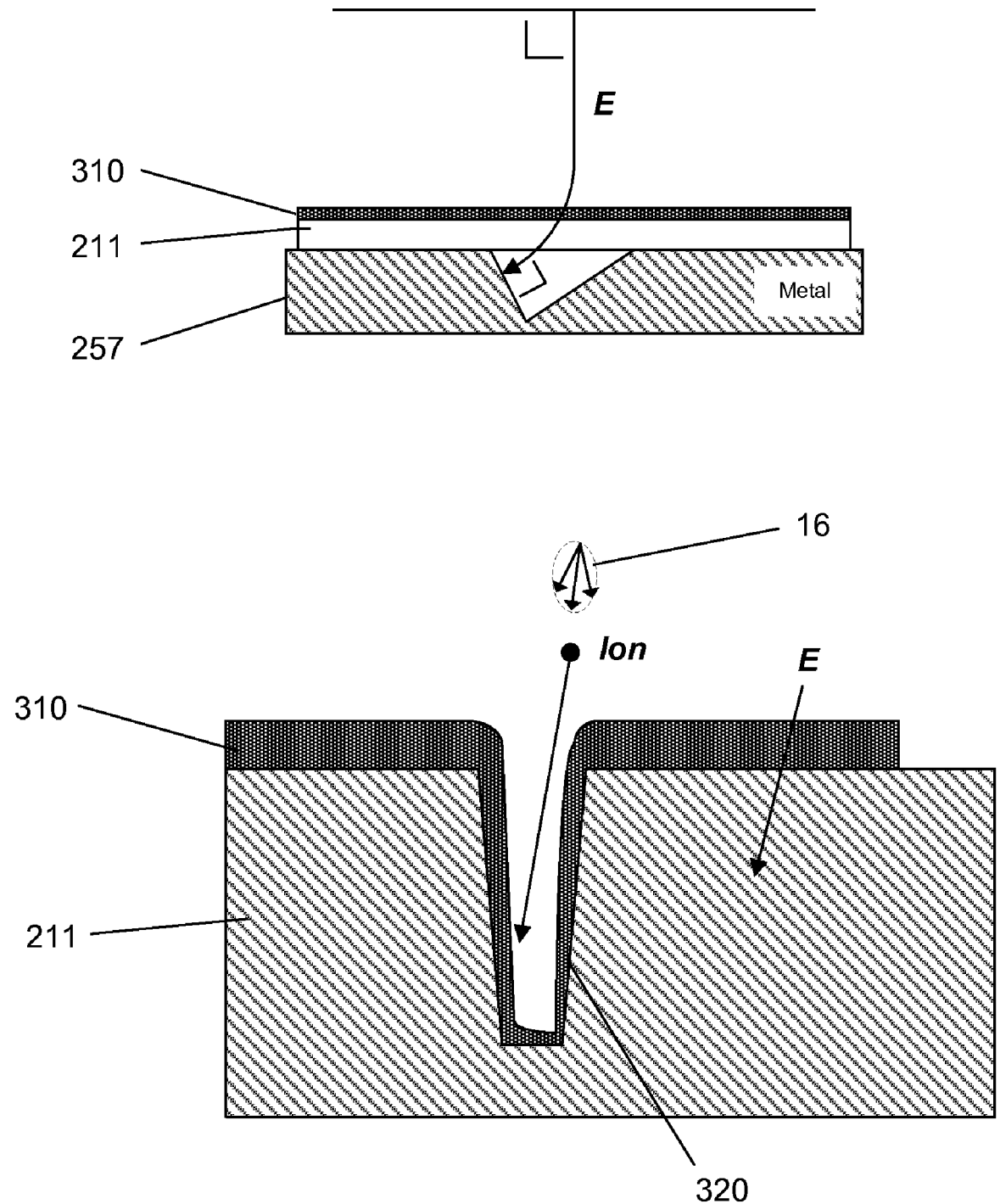
FIG. 3 is an illustration of a modified path of an ion impinging on the surface of a substrate using a non-planar electrode.

FIG. 3 is an illustration of a modified path of an ion impinging on the surface of a substrate 211 using a non-planar electrode 257. The ion may originate from a quasi-neutral gas of charged particles, comprising ions, electrons, and neutral particles, commonly referred to as a plasma. RF power is applied on the non-planar electrode 257 and the antenna 226 to deliver electromagnetic energy to the process chamber 220 and generate an electric field E. The plasma is generated between the non-planar electrode 257 and the antenna 226 of FIG. 2 and ions from the plasma impinge on a surface of the substrate 211 to etch, modify, and/or form a layer 310 based on an IADF 16.

The electric field E may be modified by a shape of the non-planar electrode 257 thereby affecting or modifying a path of an incoming ion impinging on the substrate 211 so that a virtual path of the incoming ion would strike normal to the surface of the non-planar electrode 257. The modification of the path of the incoming ion through the use of a non-planar electrode 257 can affect the angular distribution of ions incident to the surface of the substrate, thereby providing a way to provide a consistently thick film over a variety of surface structure, such as a via 320. Alternatively, a non-planar electrode 257 may also be used to form a film profile to provide a thicker film on one vertical, angled, or partially exposed surface than another, as illustrated in FIG. 3. The use of a non-planar electrode may be employed over an entire substrate or alternatively, over one or more sections of a substrate 211 thereby modifying a path of ions incident to the surface of the substrate only over one or more sections of the substrate 211. In one embodiment, modifying a path of ions incident to the surface of the substrate only over one or more sections of the substrate may be performed using a non-planar electrode comprising planar areas and notched areas.

Figure 4A:
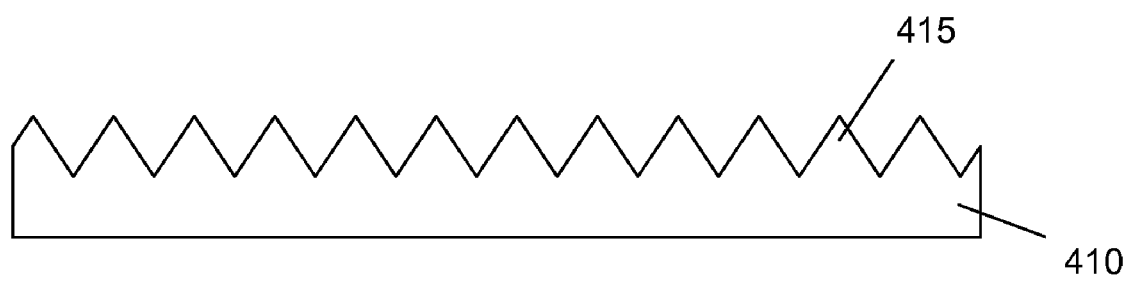
FIG. 4A is a side view illustration of a segment of a non-planar electrode according to one embodiment of the invention.

FIG. 4A is a side view illustration of an evenly notched segment 410 of the non-planar electrode 257 of FIG. 2A and FIG. 2B according to one embodiment of the invention. The evenly notched segment 410 may be comprised of a metal such as iron (Fe), aluminum (Al), chromium (Cr), nickel (Ni), manganese (Mn), copper (Cu), titanium (Ti), platinum (Pt), vanadium (V), lead (Pb), and zinc (Zn) and/or a non-metal such as carbon (C), nitrogen (N), oxygen (O), though the embodiment is not so limited. A top surface of the non-planar electrode 257 in this embodiment has an evenly notched profile, providing a consistent angular interface to modify a path of an ion incident to a surface of a substrate 211. The consistently notched segment 410 in this embodiment of the invention has a consistent notch 415 height, distribution, and profile across a width of the consistently notched segment

Figure 4B:
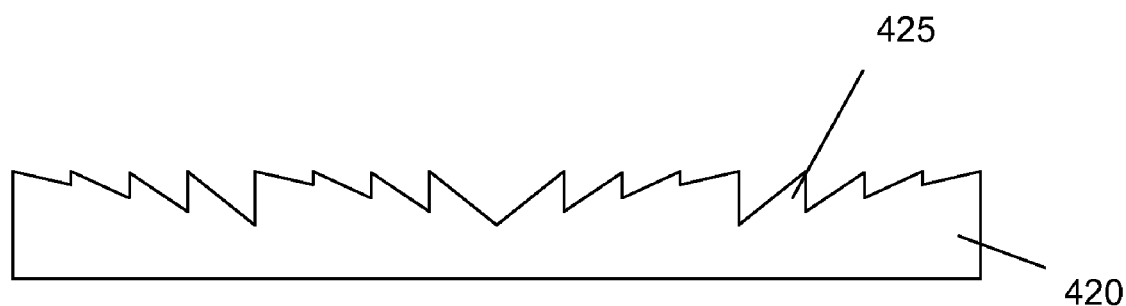
FIG. 4B is a side view illustration of a segment of a non-planar electrode according to another embodiment of the invention.
Figure 4C:
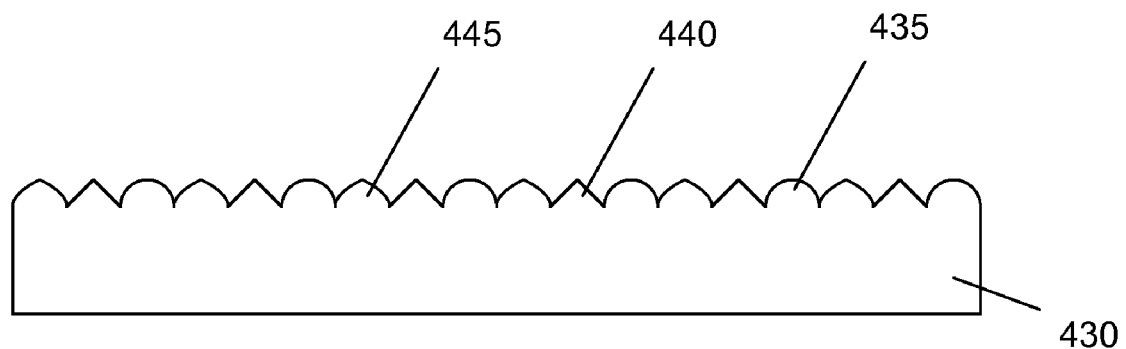
FIG. 4C is a side view illustration of a segment of a non-planar electrode according to a further embodiment of the invention.

410. As another example, an irregularly notched segment 420 is illustrated in FIG. 4B to show that an irregular notch 425 may not be uniformly shaped across a width of the non-planar electrode 257 even though the irregular notch 425 height is consistent across the irregularly notched segment 420. Further, the non-planar electrode 257 may be comprised of areas with consistent notches 415 and/or irregular notches 425 and/or areas that are planar or substantially planar. As a further example, an inconsistently notched segment 430 may have notches with a variety of shapes. The inconsistently notched segment 430 may have a variety of shapes, such as a rounded notch 435, an angular notch 440, and a curved notch 445 residing on the same inconsistently notched segment 430 of the non-planar electrode 257. A variety of shapes may be used to create a preferred IADF 16 across the substrate 211.

Figure 5A:
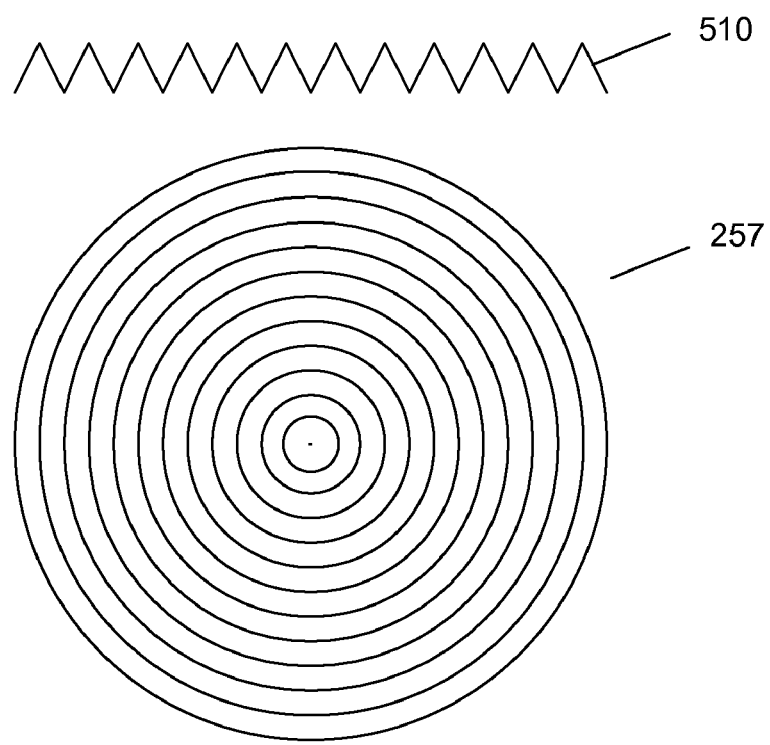
FIG. 5A is a top view illustration of a non-planar electrode according to an embodiment of the invention.
Figure 5B:
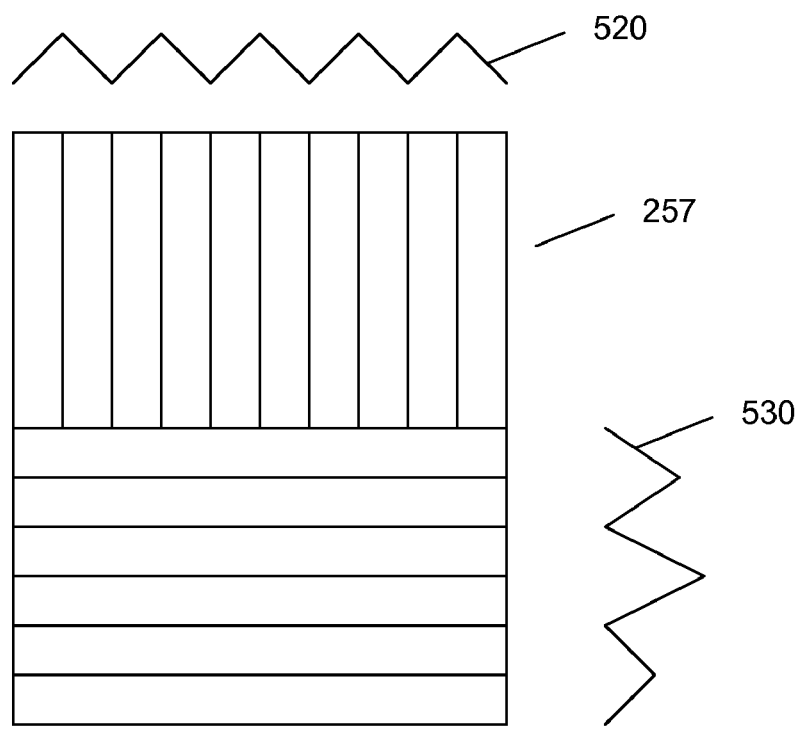
FIG. 5B is a top view illustration of a non-planar electrode according to an alternative embodiment of the invention.

FIG. 5A is a top view illustration of a non-planar electrode 257 according to an embodiment of the invention. The non-planar electrode 257 in this embodiment has a consistently notched profile 510 across the diameter of the non-planar electrode 257. An alternative embodiment of a non-planar electrode 257 is illustrated in FIG. 5B. The non-planar electrode 257 has vertically arranged consistently notched profile 520 and a horizontally arranged irregularly notched profile 530 on the non-planar electrode. Alternatively, the non-planar electrode 257 may have consistently notched vertical and horizontal profiles, irregularly notched vertical and horizontal profiles, or one or more combinations thereof on the non-planar electrode 257.

Figure 6:
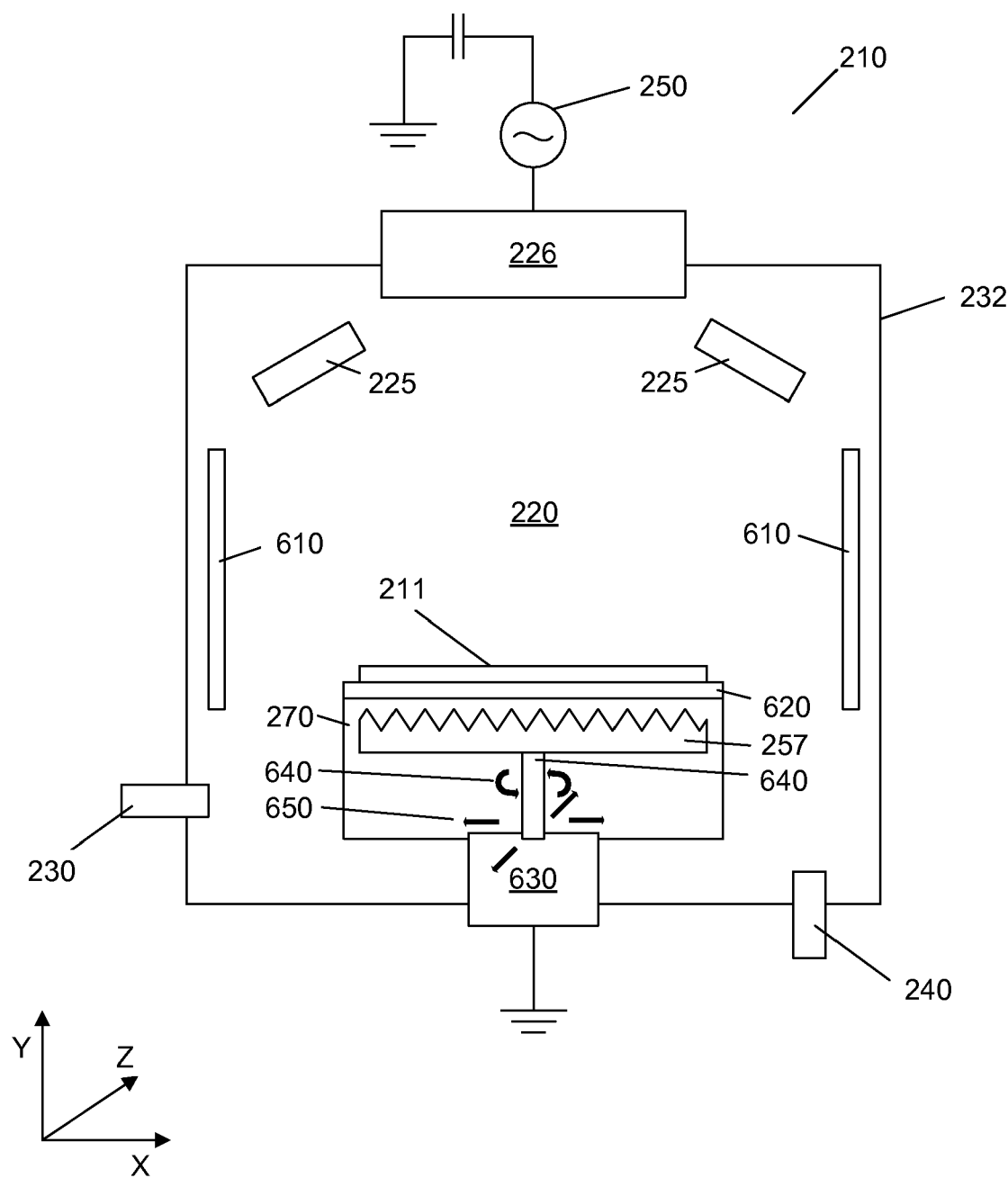
FIG. 6 illustrates an exemplary block diagram of an iPVD processing system with an irregularly shaped electrode.

FIG. 6 illustrates an exemplary block diagram of an iPVD processing module 210 with a non-planar electrode 257. The iPVD processing module 210 comprises an antenna 226 and one or more targets 225 coupled to the process chamber 220. RF power can be supplied to the antenna 226 from the RF source 250, and can be used to create an inductively coupled plasma (ICP) in the process chamber 220. The antenna 226 can be electrically connected using a RF matching network (not shown) to, and selectively energized or powered by, the RF source 250. The RF source 250 can provide a time-varying RF current at a frequency between about 100 kilahertz (kHz) and about 100 megahertz (MHz) that is supplied to the antenna 226 at a power ranging between about 100 watts (W) and about 10,000 W. For example, an operating frequency of approximately 13.56 MHz is used. Alternately, other frequencies may be used. When energized by the RF source 250, the antenna 226 radiates isotropic RF electromagnetic fields. A metallic outer enclosure or cage (not shown) can be used to surround the antenna 226 to confine the radiated RF electromagnetic fields therein to ensure the safety of nearby persons and to prevent electromagnetic interference with surrounding electronics.

In a deposition environment, one or more shields 610 may be used to capture material that would otherwise be formed on the chamber wall 232. The iPVD processing module 210 may also comprise a process gas supply system 230 that can be coupled to process chamber 220, which may comprise a plasma, and a pressure control system 240 that can be coupled to the process chamber 220. The pressure control system 240 may comprise a pump to evacuate contents from the process chamber 220. The substrate holder 270 may comprise a substrate support 620 and the non-planar electrode 257 to allow the non-planar electrode 257 to be moved relative to the substrate support 620 to affect an angular distribution of ions incident to a surface of the substrate 211. The substrate support 620 may be formed from or coated with a dielectric material or a ceramic material comprising aluminum oxide or yttrium oxide to resist damage incurred from a plasma environment and to minimize cross contamination with the substrate 211. Other suitable dielectric materials and ceramic materials may be selected, depending on the process environment. The non-planar electrode 257 may be moved relative to the substrate support 620 by a mechanism, or driver 630. The driver 630 may oscillate or spin the non-planar electrode 257 through an angle 640 and/or the driver 630 may move the non-planar electrode 257 laterally 650 in an X direction and/or a Z direction relative to the substrate support 620 to affect an angular distribution of ions incident to the surface of the substrate 211. The driver 630 may also be configured to move the non-planar electrode 257 in a Y direction either alone or in combination with an X and/or Z directional movement.

Figure 7:
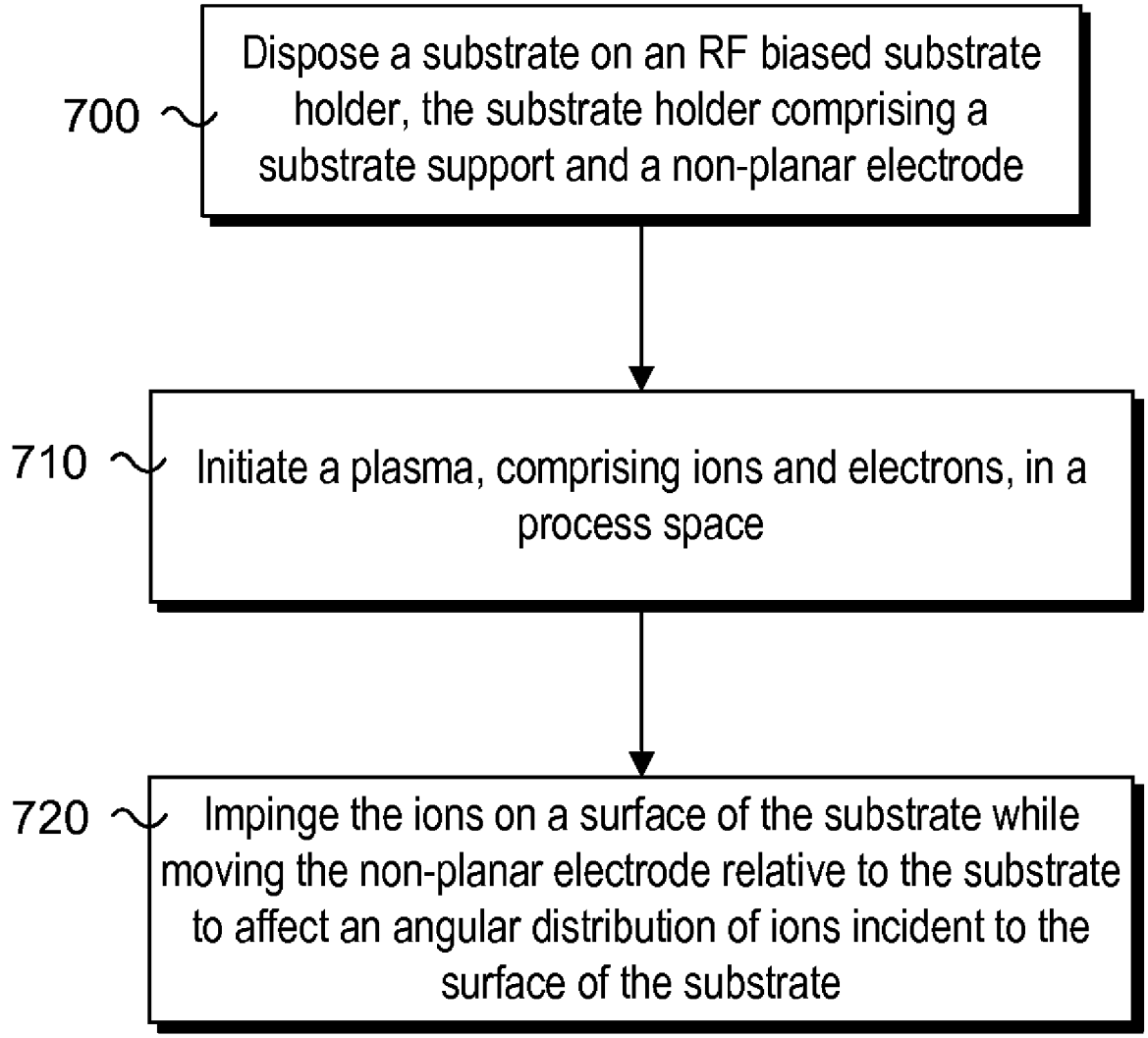
FIG. 7 presents a method of controlling an angular distribution of ions incident onto a surface of a substrate on a RF biased substrate holder.

FIG. 7 presents a method of controlling an angular distribution of ions incident onto a surface of a substrate 211 on an RF biased substrate holder 270. In element 700, a substrate 211 is disposed on an RF biased substrate holder 270, the substrate holder 270 comprising a substrate support 620 and a non-planar electrode 257. In element 710, a plasma is initiated in a process chamber 220, the plasma comprising a partially ionized gas of charged and neutral particles comprising ions, electrons, and neutral particles. In element 720, ions impinge on a surface of the substrate 211 while the non-planar electrode 257 is moved relative to the substrate 211 to affect an angular distribution of ions incident to the surface of the substrate 211. The non-planar electrode 257 may be moved relative to the substrate 211 to provide a more consistent film thickness of a deposited material across a substrate 211. Alternatively, the non-planar electrode 257 may be moved relative to the substrate 211 to create a desired film thickness profile across the wafer to correct for upstream and/or downstream processing. Further, the non-planar electrode 257 may be moved relative to the substrate 211 to create a film layer with a desired thickness on some angled, vertical, or shadowed surfaces while reducing or minimizing a thickness of the film layer on other angled, vertical, or shadowed surfaces.

A plurality of embodiments for forming very thin layers on surfaces resulting in a film with a consistent or desired thickness profile has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top."

The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of controlling an angular distribution of ions incident onto a surface of a substrate on a substrate holder during radio frequency (RF) plasma processing, comprising:
    disposing a substrate on the substrate holder, the substrate holder comprising a substrate support and a non-planar electrode; and
    impinging the ions on the surface of the substrate while moving the non-planar electrode relative to the substrate to affect the angular distribution of ions incident to the surface of the substrate.

2. The method of claim 1, wherein the substrate support is static.

3. The method of claim 1, wherein the non-planar electrode is static.

4. The method of claim 1, wherein the non-planar electrode is moved laterally relative to the substrate.

5. The method of claim 4, wherein the non-planar electrode is moved laterally relative to the substrate at a frequency between 10 and 100 Hertz.

6. The method of claim 1, wherein the non-planar electrode is rotated about an axis relative to the substrate.

7. The method of claim 6, wherein the non-planar electrode is rotated about an axis relative to the substrate at a frequency between 10 and 100 Hertz.

8. The method of claim 1, wherein the angular distribution of ions is independent of a positional orientation of the substrate support.

9. The method of claim 1, wherein a top surface of the non-planar electrode has an evenly notched profile.

10. The method of claim 9, wherein the top surface of the non-planar electrode has a consistent notch height, distribution, and profile across a width of the evenly notched profile.

11. The method of claim 1, wherein a top surface of the non-planar electrode has an irregularly notched profile.

12. The method of claim 11, wherein the top surface of the non-planar electrode has a non-uniform notch shape across a width of the irregularly notched profile.

13. The method of claim 12, wherein the top surface of the non-planar electrode has a rounded notch shape, an angular notch shape, or a curved notch shape, or a combination of two or more thereof.

14. The method of claim 11, wherein the irregularly notched profile has a consistent height across a width of the irregularly notched profile.

15. The method of claim 1, wherein a top surface of the non-planar electrode has a consistently notched profile across a diameter of the non-planar electrode.

16. The method of claim 1, wherein a top surface of the non-planar electrode has a vertically arranged consistently notched profile and a horizontally arranged consistently notched profile on the non-planer electrode.

17. The method of claim 1, wherein a top surface of the non-planar electrode has consistently notched vertical and horizontal profiles, irregularly notched vertical and horizontal profiles, or one or more combinations thereof.

18. A method of controlling an angular distribution of ions incident onto a surface of a substrate on a substrate holder during radio frequency (RF) plasma processing, comprising:
    disposing a substrate on the substrate holder, the substrate holder comprising a substrate support and a non-planar electrode, wherein a top surface of the non-planar electrode has an evenly notched profile; and
    impinging the ions on the surface of the substrate while moving the non-planar electrode relative to the substrate to affect the angular distribution of ions incident to the surface of the substrate, wherein the moving comprises oscillating or spinning the non-planar electrode through an angle, or moving the non-planar electrode laterally in an X direction, an Y direction, or a combination thereof.

19. The method of claim 18, wherein the substrate support is static.

20. A method of controlling an angular distribution of ions incident onto a surface of a substrate on a substrate holder during radio frequency (RF) plasma processing, comprising:
    disposing a substrate on the substrate holder, the substrate holder comprising a substrate support and a non-planar electrode, wherein a top surface of the non-planar electrode has an irregularly notched profile; and
    impinging the ions on the surface of the substrate while moving the non-planar electrode relative to the substrate to affect the angular distribution of ions incident to the surface of the substrate, wherein the moving comprises oscillating or spinning the non-planar electrode through an angle, or moving the non-planar electrode laterally in an X direction, an Y direction, or a combination thereof.

* * * * *